United States Patent [19]

Shevtchuk et al.

[11] Patent Number: 4,604,298

[45] Date of Patent: Aug. 5, 1986

[54] FINGER LINE SCREEN PRINTING METHOD AND APPARATUS

[75] Inventors: Victor Shevtchuk, Trenton; Nhut Chau, Jackson, both of N.J.; Richard C. Schuessler, Levittown, Pa.

[73] Assignee: Gulton Industries, Inc., East Greenwich, R.I.

[21] Appl. No.: 700,683

[22] Filed: Feb. 12, 1985

[51] Int. Cl.$^4$ ............................................... H05K 3/06
[52] U.S. Cl. ...................................... 427/96; 427/282; 427/102
[58] Field of Search ........................... 427/96, 282, 102

[56] References Cited

U.S. PATENT DOCUMENTS

| | | | |
|---|---|---|---|
| 3,663,276 | 5/1972 | Allington | 427/101 |
| 3,950,200 | 4/1976 | Muramoto | 427/96 |
| 4,037,315 | 7/1977 | Stapleton | 427/96 |
| 4,343,833 | 8/1982 | Sawae | 427/96 |
| 4,481,881 | 11/1984 | Okano | 427/306 |

FOREIGN PATENT DOCUMENTS

| | | | |
|---|---|---|---|
| 85118 | 10/1971 | Fed. Rep. of Germany | 427/96 |
| 2616060 | 11/1976 | Fed. Rep. of Germany | 427/96 |

OTHER PUBLICATIONS

Kadota et al., "Gold Conductor Pastes for High Density Circuit" Electrocomponent Science and Technology, 1981, vol. 9, No. 1, pp. 31–41.

Goklman, "Control of Paste Spreading in Screening Process" IBM TDB vol. 19, No. 11, Apr. 1977, pp. 4263.64.

Hashimoto, "Selective Glaze for Last Line Visible Thermal Head" Electrocomponent Science and Technology, 1981, vol. 8, Nos. 1 & 2, pp. 115–121.

Primary Examiner—John D. Smith
Attorney, Agent, or Firm—Darby & Darby

[57] ABSTRACT

A method of screen printing a conductive ink onto a substrate to form a pattern of narrow, closely spaced conductive lines. Before screening, the conductive ink is exposed to ambient air until its viscosity is in the range 700,000 to 900,000 centipoise at 70° Fahrenheit.

7 Claims, 1 Drawing Figure

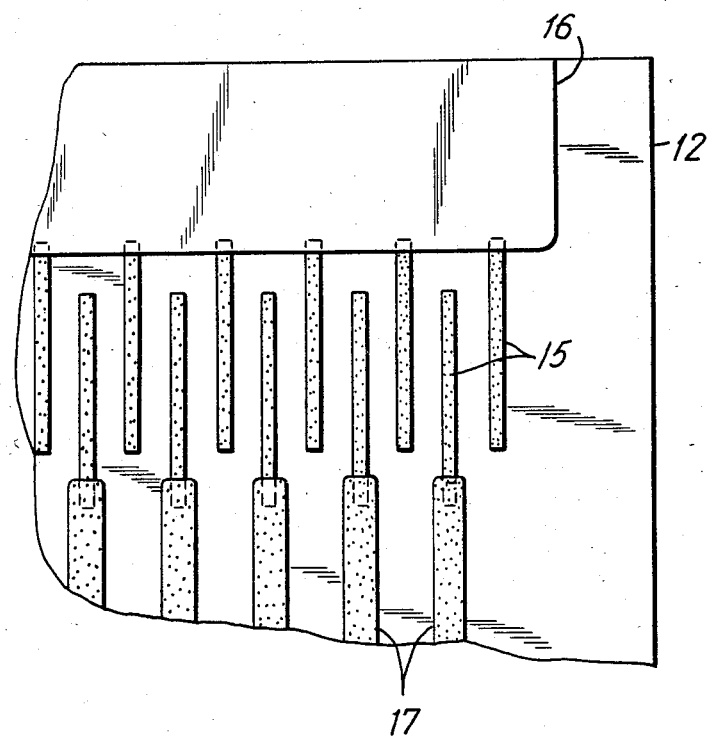

FINGER LINE SCREEN PRINTING METHOD AND APPARATUS

This invention relates broadly to high speed automatic screen printing and thick-film processing methods and equipment such as those used in fabricating hybrid thick-film components, circuits and interconnections. In particular, the invention relates to methods and apparatus for screen printing closely spaced conductive finger lines on a substrate.

BACKGROUND OF THE INVENTION

Many electronic devices require the placement of conductive lines on a substrate, such as in the case of printed circuit boards, hybrid thick-film components, and the like. These conductive lines serve as electrical interconnections between discrete components, between components and interconnection means, or as conduits between electrical connectors, for example. It has been a continuing trend in the electronics industry to miniaturize the components, connectors, and other devices, so as to provide greater performance, efficiency and portability of electronic apparatus. One factor limiting the extent of miniaturization has been the physical space required for the interconnecting conductive lines themselves.

In the particular industry relating to thermal printing aparatus, miniaturization of components and circuitry is one approach to the development of thermal printers which are capable of exceptionally high print resolutions. In a thermal printer, heat-sensitive paper, tape, or other thermal medium, is placed in contact with a heating element; when the heating element is electrically energized, the transmitted heat causes a mark to appear on the paper, at the location of the heating element and in the shape of that heating element. A row of heating elements can thus simultaneously print a complete row of marks, such as dots, for example. If the heat-sensitive paper is moved along a row of dot-shaped heating elements at a predetermined speed, the heating elements can be energized and de-energized in such a fashion in timed correspondence with the paper movement so that recognizable patterns of dots are formed on the paper. These patterns may be letters, numbers, other characters, designs, or virtually any desired image. The part of thermal printing apparatus which produces the heated areas is known as a thermal print head.

The thermal print head comprises a row of heating elements (either discrete or continuously formed) mounted on a substrate or base, with controlling circuitry for determining operation of the individual heating elements, means for attaching the print head to the rest of the thermal printing apparatus, and electrical interconnection means for providing the control circuitry and heating elements with power, ground connection, and data signals.

In one particular type of print head, the individual heating elements are formed by adjacent contiguous sections of a continuous resistor bar, customarily known as an R-bar. Directly underneath the R-bar are interleaved conductive fingers, with every other finger being a ground finger. All of the ground fingers are connected together by a common ground conductor line adjacent to and extending along the length of the R-bar. Interleaved between each pair of ground fingers is a signal finger, connected by individual conductive lines printed on the surface of the print head substrate or base material to the controlling circuitry, located away from the R-bar, to avoid interfering with contact of the moving heat-sensitive paper with the R-bar. In order to continue the trend of miniaturization of the print head, improved methods of placing these conductive finger lines on a substrate more closely and with thinner lines had to be developed.

There are at least three ways to place conductive lines on a substrate: chemical etching; ion, or plasma, beam etching, and screen-printing. Chemical etching involves the use of a mask, resembling the desired pattern of conductive lines, which is placed over a film of conductive material. The exposed conductive material is then chemically etched away at the openings in the mask, thus leaving the desired conductive pattern on the substrate. The chemical etching process, however, has several inherent disadvantages. Many different process steps and materials are required, including application of a conductive film to a substrate, application of a mask onto the conductive film, etching in a chemical bath, stopping the chemical etching reaction, cleaning the workpiece, and so on. In addition, each of the process steps is highly sensitive to slight variations in operating parameters, such as temperature of the solutions, uniformity of the conductive film and mask materials, and especially, timing of the etching step. Furthermore, the chemicals and processes employed are potentially hazardous to operators and technicians, and require great care in handling. These factors combine to make chemical etching an expensive and variable method of applying conductive lines to a substrate.

An additional problem with chemical etching arises it is desired that very fine and closely spaced spaced lines remain on the substrate. For any thickness of conductive film, a predetermined time is required for the etchant to completely remove the film at a particular location. The action of the etchant is not unidirectional, however, and during the time required for the etchant to work completely down through a conductive layer, the etchant also etches laterally, under the mask. Because of this "undercut", the remaining conductive lines are narrower at the top of the lines than at the bottom surface adjacent to the substrate. Additionally, corners which were sharp on the mask become rounded, to a certain degree. These problems add to the expense and variability of chemical etching.

Ion, or plasma, beam etching is an emerging technology which utilizes a stream of charged particles to etch away conductive material exposed through openings in a mask, or photo-resist layer placed over the conductive film. This method and its associated apparatus, while it promises to provide unidirectional etching without undercutting, is not sufficiently understood or developed to be commercially practicable on a widely available basis.

Screen printing is a "positive additive" technique, fundamentally different from the two processes mentioned above, in that conductive material is applied to a blank substrate in precisely the desired pattern. This is achieved by the use of apparatus including a screen having apertures corresponding to the desired conductor line pattern, a conductive ink or paste, and a squeegee for forcing the ink through the screen onto the substrate held under the screen. Screen printing in this manner is less expensive, more reliable, and far simpler than either chemical etching or ion beam etching.

Until the present invention, the narrowest conductive lines producible by practical screen printing were approximately 0.005 inch to 0.007 inch (5–7 mils) wide. A major disadvantage with the inks and screens in previous use, was the inability to prevent the ink from spreading laterally after having been squeegeed through the screen. A conductive ink which would not spread after squeegeeing and an appropriate screen for use in conventional screen printing apparatus would provide a simple, inexpensive, widely available method and apparatus for placing closely spaced narrow conductive finger lines on a substrate at higher resolutions than achievable with other available screen printing apparatus.

OBJECTS OF THE INVENTION

Broadly, it is an object of this invention to provide a method and apparatus for placing closely spaced narrow conductive finger lines on a substrate. Specifically, an object of the invention is to provide an arrangement for placing conductive finger lines at least as narrow as 0.00175 inch (1.75 mils) on a substrate, evenly spaced at least as close as 0.0049 inch, center to center, using screen printing techniques.

It is another object of the invention to provide screen-printed conductive finger lines on a substrate sufficiently closely spaced and narrow to be suitable for use with miniaturized electronic components and interconnection devices and methods.

Another object of the invention is to provide conductive finger lines on a substrate with widths as small as 1.75 mil without exposing technicians and operators to potentially harmful chemicals used in chemical etching or ionized particle energies used in ion beam etching.

Another object of the invention is to provide a simple, inexpensive, and reliable method and apparatus for screen printing conductive finger lines at least as narrow as 0.00175 inch (1.75 mils) onto a substrate.

In accordance with an illustrative embodiment of the present invention, a conductive ink is provided which exhibits little or no lateral spreading after being screen printed onto a substrate. A screen having particular dimensional and tension characteristics is provided for use with conventional screen printers. A method of using the ink and screen is disclosed which provides the beneficial results described above.

The foregoing brief description, as well as further objects, features and advantages of this invention will be more completely understood from the following detailed description of a preferred, but nonetheless illustrative, embodiment of the invention, taken together with the accompanying drawing, in which:

FIG. 1 is a plan view of a finger line pattern screen printed on a substrate, according to the present invention.

Referring to FIG. 1, there is shown an illustrative example of screen-printed conductive finger lines according to the present invention. Parallel and interleaved conductive finger lines 15 are screen-printed onto a substrate 12. An end of each finger line overlaps or forms a respective wider conduolive line 17, or alternately, a common conductor bar 16. The conductor bar 16 and conductive lines 17 are preferably printed over the finger lines 15, by a second screen printing operation. This arrangement is illustrative only, showing one application of the present invention relating, for example, to the circuitry of a thermal print-head for thermal printing apparatus.

The finger lines 15 in this illustrative embodiment may be under 0.002 inch wide (preferably approximately 0.00175 inch or 1.75 mils wide), approximately 0.050 inch (50 mils) long, and may range in thickness from 0.0002 to 0.0003 inch after the assembly has been fired in a firing furnace, in a customary subsequent fabrication step. The finger lines may be spaced less than 0.005 inch or 5 mils apart (illustratively approximately 0.0049 inch or 4.9 mils apart) center to center. These dimensions will be understood to be illustrative only, and many variations on the length, spacing and width of the finger lines will be readily apparent to those skilled in the art.

The finger lines 15 are screen-printed by means of a screen-printing system comprising conductive ink having properties according to the invention, a screen having special characteristics according to the present invention, and a customary screen printer, such as C. W. Price model 212, or its equivalent. The screen comprises an essentially pure molybdenum sheet (such as 99.9% pure and meshless) having a pattern of apertures corresponding to the finger line pattern shown in FIG. 1. These apertures may be formed by etching. The screen is very thin, having preferably a thickness of approximately 0.001 inch (1 mil) within 5%, and is essentially free from dents or depressions near the etched pattern which might produce defective printed patterns on the substrate. The screen is set in a tensionable screen frame (e.g., 8 inches by 10 inches) for mounting the screen in the screen printer, and the tension of the screen is made relatively high (in comparison to conventional screen tensions), being adjusted to approximately 8 to 15 mils deflection per pound-force applied. The particular tension adjustment will depend on the particular screen frame used; for example, the deflection may be at the low end of the range if a 5 inch by 5 inch frame is used. This adjustment need not be made by an exact measurement, but may be made by feel by an experienced screen-printer operator, to avoid having such measurement destroy the very thin molybdenum screen. Such a screen material is now available from Towne Laboratories, Inc., 1 U.S. Highway 206, Somerville, N.J. 08876.

The use of the meshless screen limits the size of the finger line pattern which may be screened according to this invention. The finger lines 15 shown in FIG. 1 are approximately 0.050 inch (50 mils) long. If longer lines are desired, the pattern etched into the metallic screen would remove so much material from the metal sheet that the screen might lose its structural integrity, and break apart during tensioning. Since the electronics industry generally requires conductive lines longer than about 50 mils, production of such conductive finger lines by screen printing is not known.

A special screenable conductive ink slurry is used according to the present invention. This ink is a thick-film paste including a highly conductive gold bearing material and may be prepared for, example, from GOLD CERMET CONDUCTIVE COATING #8835-1B, commercially available from Electro-Science Laboratories, Inc., 2211 Sherman Avenue, Pennsauken, N.J. 08110, U.S.A.

According to the present invention, it has been determined that a gold bearing paste may be successfully screen-printed in lines approaching 1 mil in width, by using a paste (e.g., ink or slurry) much thicker than commercially available gold-bearing thick-film pastes. Conductive lines of 5 mil width are conventionally screenable with viscosities ranging from 275,000 to 375,000 centipoise at 70° F. It is known that these pastes, as commercially prepared, include thinners. It was thought that by heating the gold paste, some of the thinner could be evaporated out of the paste and the ink slurry would thicken. Tests and experiments were performed in order to determine the proper time/temperature profile for evaporating the thinning agent, and also to determine the proper viscosity range for fine finger line screening.

These initial tests proved fruitless. Heating of the gold paste resulted in the formation of a "skin" or crust on top of the paste which rendered the paste non-homogeneous and unusable. Vacuum evaporation methods produced the same non-homogeneity. It was then discovered that the paste could be appropriately thickened simply by allowing it to stand at room temperature ranging from 65°–75° F. for an extended period of time. During such a slow evaporation process at approximately 70° F., no skin formed on the paste as it thickened. The viscosity of the paste, as determined in a customary viscosimeter at regular intervals over a period of several days, was raised in about five days from approximately 300,000 centipoise at 70° F. to viscosity levels ranging from 700,000 to 900,000 centipoise at 70° F. Such elevated viscosities were found advantageous in attaining the desired fine lines.

When screen printed using the above-described screen, the thickened paste produced the desired narrow conductive finger lines without undue lateral spreading. The squeegee was drawn across the screen at speeds ranging from 5 to 7 inches per second, with 6 inches per second being preferred. The preferred range of viscosity was found to be 775 thousand to 850 thousand centipoise at 70° F. The thickness of the screen printed pattern ranged from 0.0002 to 0.0003 inch after firing in a firing furnace, such as a Watkins-Johnson Model 12CA, at peak temperature of 850° Celsius for approximately 10 minutes, using customary temperature/time profiles.

The use of a highly viscous gold alloy thick-film paste, coupled with a properly tensioned etched pattern screen, and other customary screen printing apparatus, has been shown to produce highly beneficial and desirable conductive finger lines on a substrate, with finger lines at least as narrow as 1.75 mils in width and evenly spaced at least as closely as 4.9 mils, center to center. These lines are achieved without the expense, variability, and potential hazards of chemical etching and ion beam etching processes.

It will be understood that the above-described illustrative embodiment is only one preferred example of aspects of the present invention. Numerous additions, substitutions, and modifications are possible without departing from the scope or spirit of this invention, which is limited only by the appended claims. For example, other materials which may be satisfactory for use in preparing the screen include beryllium-copper alloys, copper and copper alloys, stainless steels, and tungsten. The etched pattern may be any desired configuration, and need not be the interleaved fingers or lines-and-spaces pattern shown in FIG. 1.

What is claimed as the invention is:

1. A method of screen printing a conductive ink onto a substrate to form a pattern of conductive lines adapted to be narrow and closely spaced, said method comprising the steps:

leaving said conductive ink exposed to air until said ink has a viscosity ranging from 700,000 to 900,000 centipoise at 70° Fahrenheit, said air having temperature ranging from 65° to 75° Fahrenheit, and after said exposure forcing said ink through a screen onto said substrate, said screen being a thin metallic sheet having a pattern of apertures.

2. The method of claim 1, at least two of said apertures being evenly spaced less than 0.005 inches apart, center to center.

3. The method of claim 1 wherein said sheet has a thickness of the order of 0.001 inch.

4. The method of claim 2 wherein said apertures are less than 0.002 inch wide.

5. The method of claim 1 wherein said sheet is tensioned to have between 8 to 15 mils deflection per pound-force centrally applied.

6. The method of claim 4 whrein said sheet has a thickness of the order of 0.001 inch and is tensioned to have between 8 to 15 mils deflection per pound-force centrally applied.

7. The method of screen printing a conductive ink according to claim 6, further comprising the step:

thereafter firing said substrate at a peak temperature ranging from 800° to 900° Celsius.

* * * * *